United States Patent
Yoshida

(10) Patent No.: US 11,774,017 B2
(45) Date of Patent: Oct. 3, 2023

(54) PIPE CONNECTION STRUCTURE AND PROCESSING APPARATUS

(71) Applicant: Tokyo Electron Limited, Tokyo (JP)

(72) Inventor: Takashi Yoshida, Oshu (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/654,281

(22) Filed: Mar. 10, 2022

(65) Prior Publication Data

US 2022/0299137 A1  Sep. 22, 2022

(30) Foreign Application Priority Data

Mar. 19, 2021 (JP) .................................. 2021-045996

(51) Int. Cl.
*F16L 23/036* (2006.01)
*F16L 27/10* (2006.01)

(52) U.S. Cl.
CPC .......... *F16L 23/036* (2013.01); *F16L 27/1012* (2013.01)

(58) Field of Classification Search
CPC ....... F16L 23/036; F16L 23/162; F16L 23/04; F16L 23/02; F16L 21/06; F16L 25/14; F16L 27/1012; F16L 27/1133; F16L 41/007; F16L 27/026; F16L 27/08
USPC ........ 285/411, 179, 406, 410, 415, 364, 366
See application file for complete search history.

(56) References Cited

U.S. PATENT DOCUMENTS

| | | | |
|---|---|---|---|
| 2,628,851 A * | 2/1953 | Jessup | F16L 27/1133 285/411 |
| 2,716,563 A * | 8/1955 | Seneschall | 285/364 |
| 4,448,448 A * | 5/1984 | Pollia | |
| 7,425,023 B2 * | 9/2008 | Hartig | 285/406 |
| 8,708,038 B2 * | 4/2014 | Tucker | 285/364 |
| 9,599,263 B2 * | 3/2017 | Lutzer | F16L 27/08 |
| 2021/0300564 A1 * | 9/2021 | Lutzer | F16L 27/1012 |

FOREIGN PATENT DOCUMENTS

| | | | |
|---|---|---|---|
| CN | 105497939 A | * | 4/2016 |
| CN | 111996514 A | * | 11/2020 |
| EP | 166846 A | * | 1/1986 |
| JP | 2012-104755 A | | 5/2012 |

OTHER PUBLICATIONS

EP0166846A2—Machine Translation—English (Year: 1984).*
CN 105497939 A—Machine Translation—English (Year: 2016).*
CN 111996514 A—Machine Translation—English (Year: 2020).*

* cited by examiner

*Primary Examiner* — Zachary T Dragicevich
*Assistant Examiner* — William S. Choi
(74) *Attorney, Agent, or Firm* — Armstrong Teasdale LLP

(57) ABSTRACT

A pipe connection structure provided in a processing apparatus, includes a first pipe having a first flange portion formed at one end thereof, a second pipe having a second flange portion formed at one end thereof and connected to the first flange portion, and a pipe clamp configured to connect and fasten the first flange portion and the second flange portion at a plurality of positions including a position where a pipe axis of the first pipe and a pipe axis of the second pipe do not coincide with each other.

18 Claims, 9 Drawing Sheets

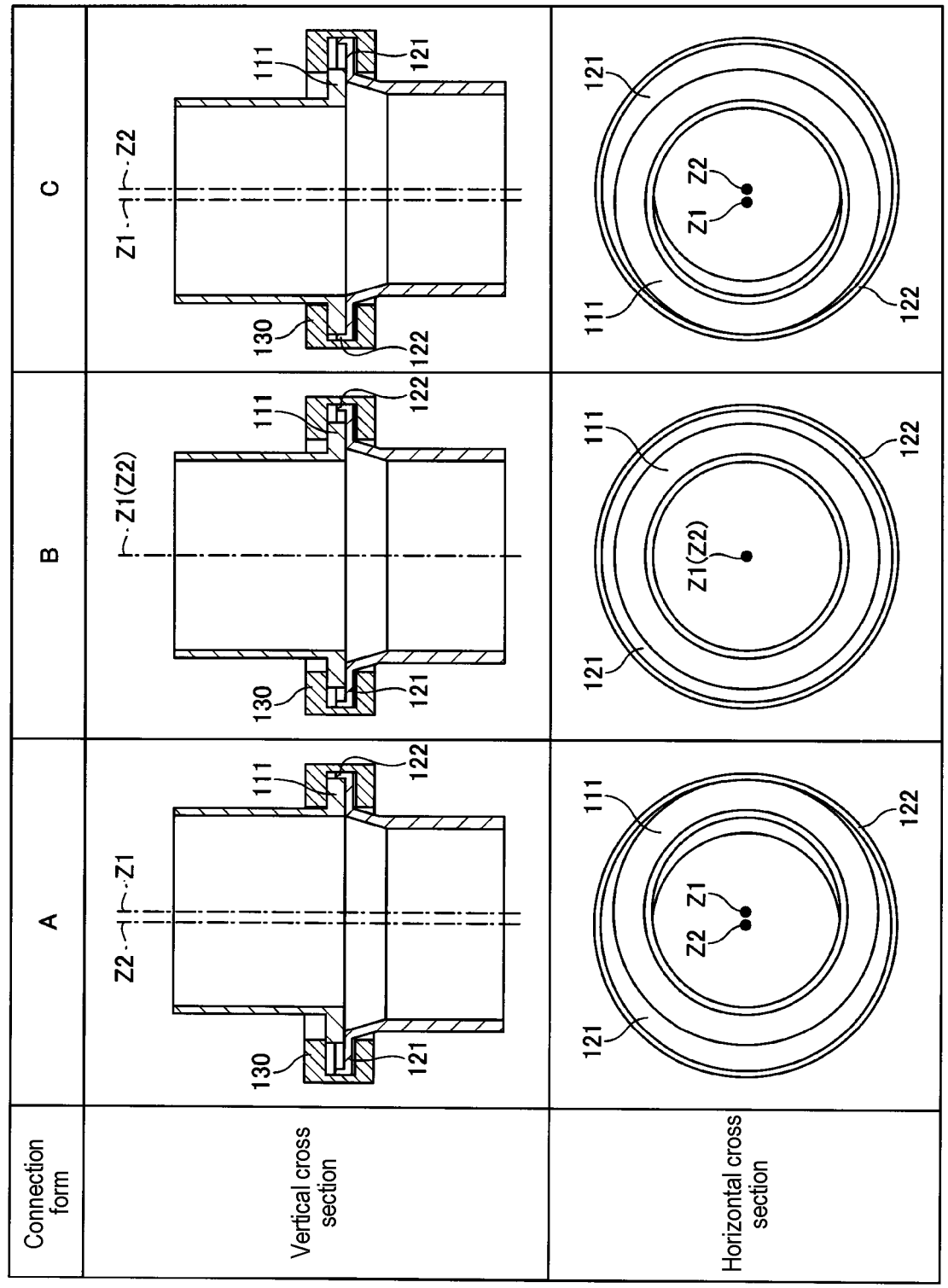

PIPE CONNECTION STRUCTURE AND PROCESSING APPARATUS

CROSS-REFERENCE TO RELATED APPLICATION

This application is based upon and claims the benefit of priority from Japanese Patent Application No. 2021-045996, filed on Mar. 19, 2021, the entire contents of which are incorporated herein by reference.

TECHNICAL FIELD

The present disclosure relates to a pipe connection structure and a processing apparatus.

BACKGROUND

There is known a vacuum processing apparatus in which a bellows is used for an exhaust pipe to absorb an error of each part (see Patent Document 1).

PRIOR ART DOCUMENT

Patent Document

Patent Document 1: Japanese Laid-Open Patent Publication No. 2012-104755

SUMMARY

According to one embodiment of the present disclosure, there is provided a pipe connection structure provided in a processing apparatus, including a first pipe having a first flange portion formed at one end of the first pipe, a second pipe having a second flange portion formed at one end of the second pipe and connected to the first flange portion, and a pipe clamp configured to connect and fasten the first flange portion and the second flange portion at a plurality of positions including a position where a pipe axis of the first pipe and a pipe axis of the second pipe do not coincide with each other.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 6 is a diagram showing connection forms of a first pipe and a second pipe.

DETAILED DESCRIPTION

Figure 1:
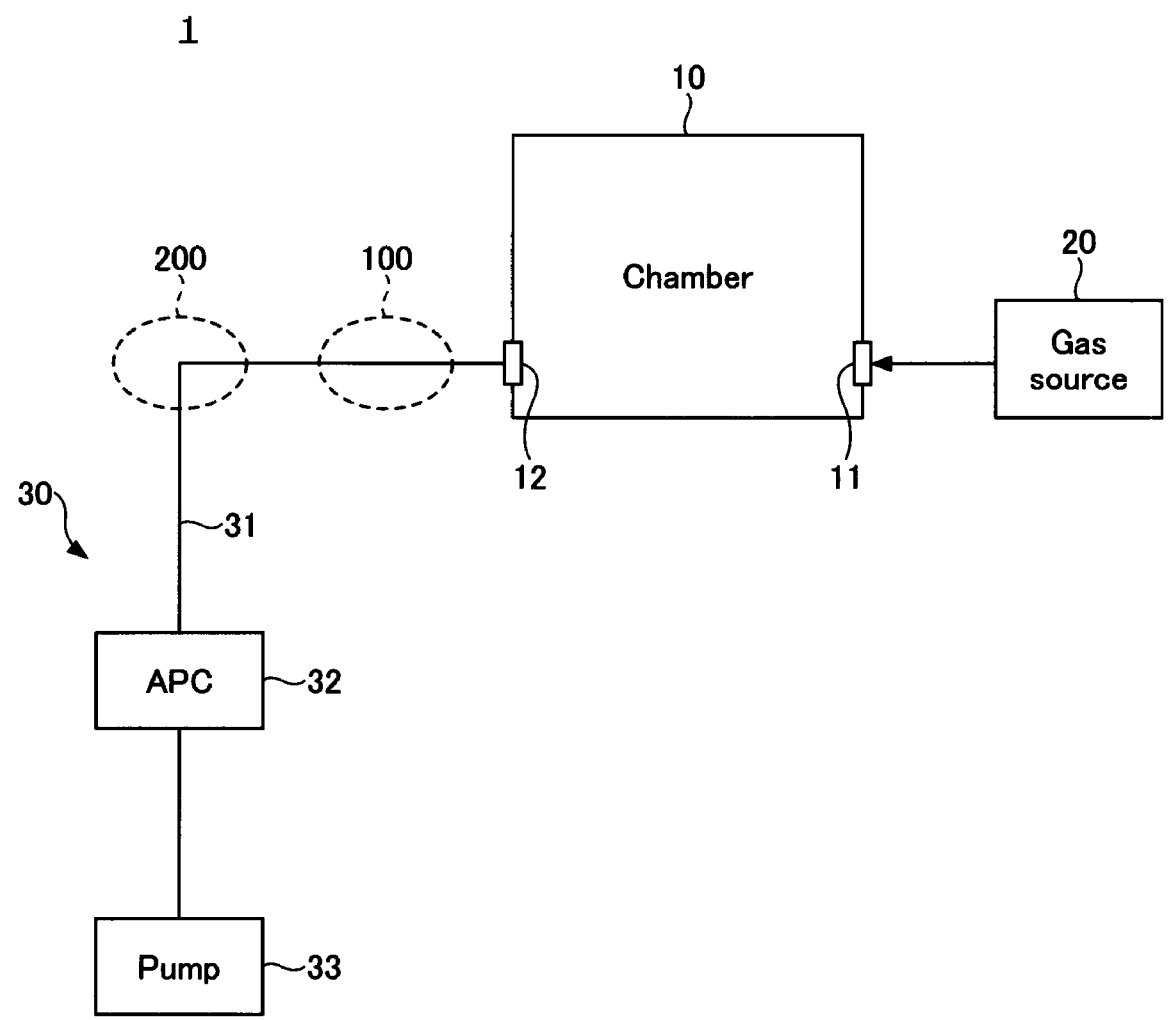
FIG. 1 is a schematic diagram showing an example of a processing apparatus according to an embodiment.
Figure 2:
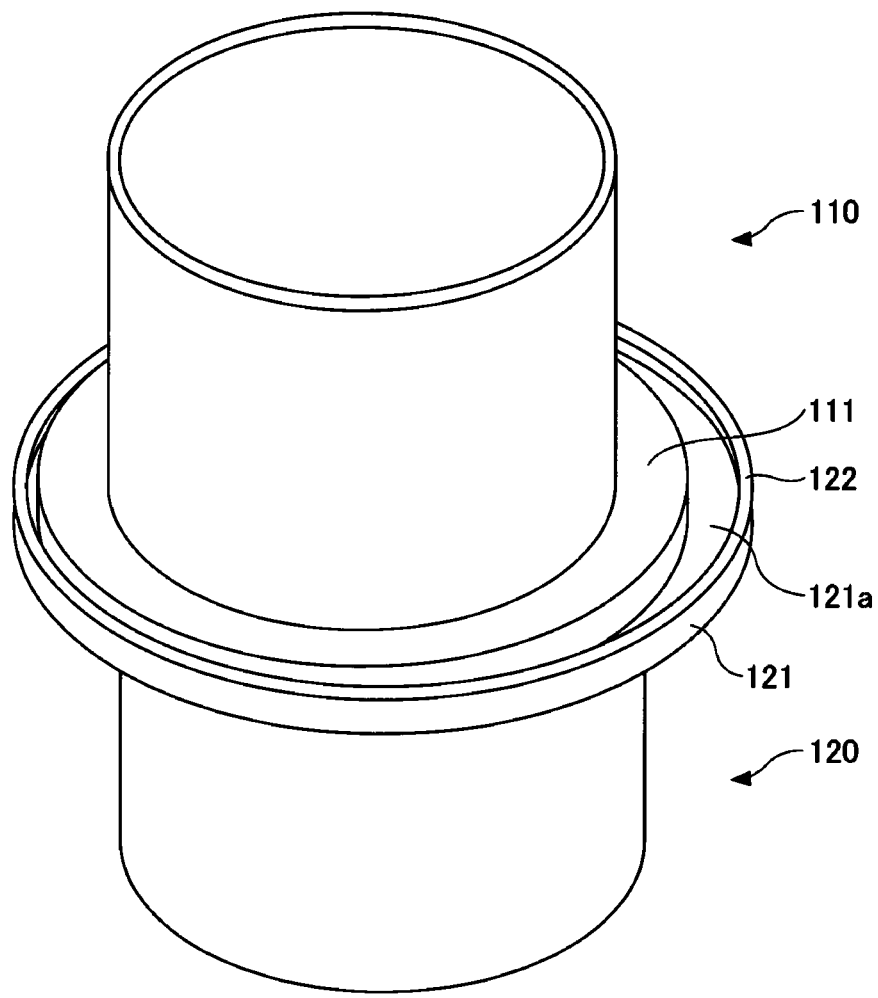
FIG. 2 is a perspective view showing an example of a pipe connection structure according to an embodiment.
Figure 3:
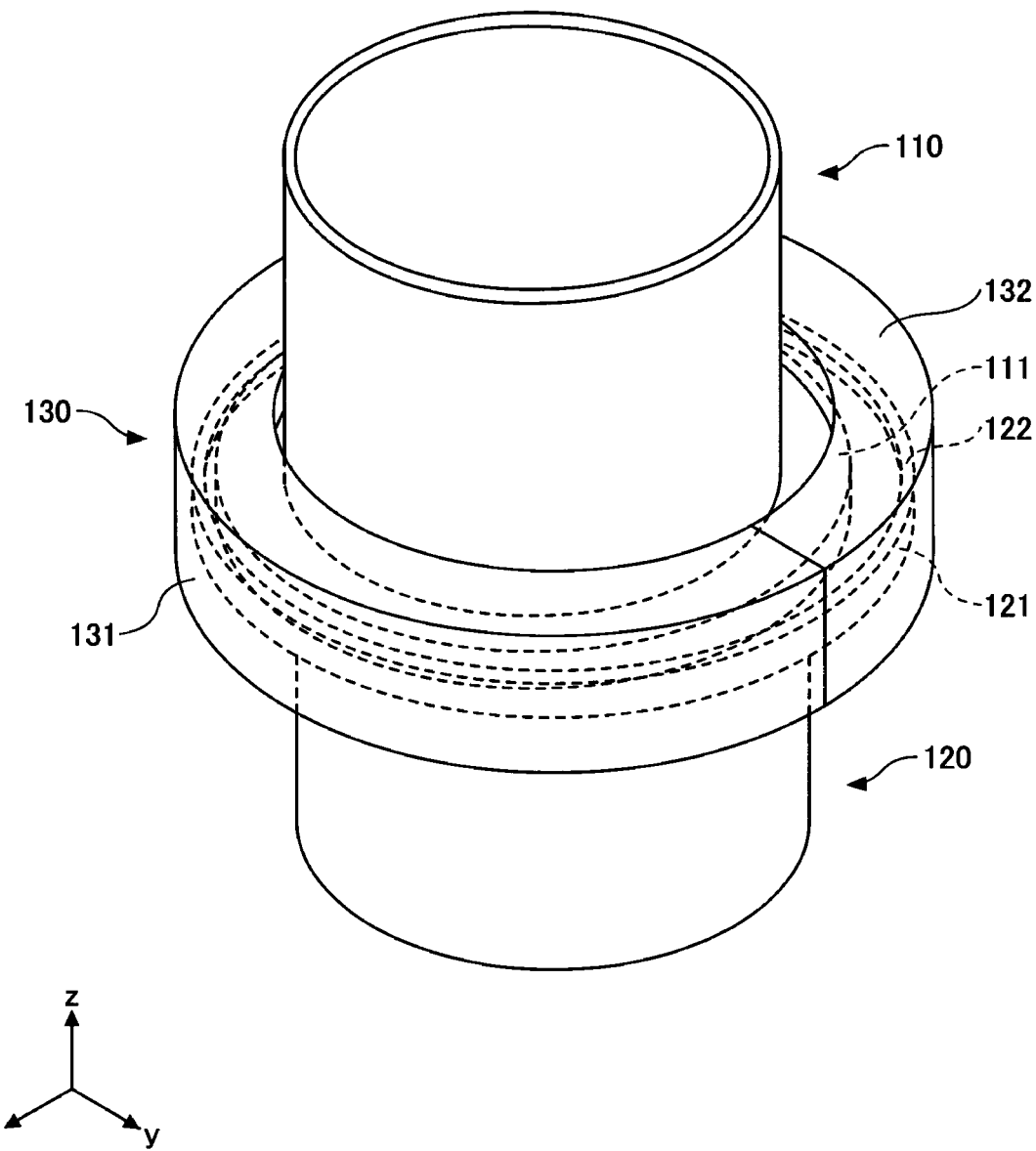
FIG. 3 is another perspective view showing an example of a pipe connection structure according to an embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, non-limiting exemplary embodiments of the present disclosure will be described with reference to the accompanying drawings. Throughout the attached drawings, the same or corresponding members or parts are designated by the same or corresponding reference numerals, and duplicate descriptions thereof are omitted.

[Processing Apparatus]

An example of the processing apparatus according to an embodiment will be described with reference to FIG. 1. The processing apparatus according to the embodiment is an apparatus that accommodates a substrate in a processing container (chamber) and performs a predetermined process (e.g., a film-forming process or an etching process) on the substrate. The processing apparatus may be a batch type apparatus that processes a plurality of substrates at a time or may be a single-substrate type apparatus that processes one substrate at a time. Further, the processing apparatus may be a semi-batch type apparatus that processes a plurality of substrates arranged on a rotary table in a processing container by revolving the substrates with the rotary table and allowing the substrates to sequentially pass through a region to which a first gas is supplied and a region to which a second gas is supplied.

The processing apparatus 1 includes a processing container 10, a gas supply 20, an exhauster 30, and the like. In the processing apparatus 1, the gas supply 20 supplies a processing gas into the processing container 10, so that the substrate accommodated in the processing container 10 is subjected to a predetermined process. Further, in the processing apparatus 1, the processing gas supplied into the processing container 10 is exhausted by the exhauster 30.

The processing container 10 is configured to accommodate the substrate. The processing container 10 has a supply port 11 through which the processing gas is supplied from the gas supply 20 into the processing container 10. The processing container 10 has an exhaust port 12 through which the processing gas is exhausted from the inside of the processing container 10.

The gas supply 20 includes a processing gas supply source, a valve, a flow rate controller (none of which is shown), and the like. The gas supply 20 supplies the processing gas, the flow rate of which is controlled by the flow rate controller, into the processing container 10 via the supply port 11. The supply and cutoff of the processing gas from the processing gas supply source into the processing container 10 is controlled by opening and closing the valve.

The exhauster 30 includes an exhaust line 31, an APC valve 32, a vacuum pump 33, and the like. The exhaust line 31 includes, for example, an exhaust pipe, and connects the exhaust port 12 and the vacuum pump 33. The exhaust line 31 includes at least one of a pipe connection structure 100 and a pipe connection structure 200, which will be described later. The APC valve 32 is installed on the exhaust line 31 to adjust an exhaust rate by adjusting the conductance of the exhaust line 31. The vacuum pump 33 includes, for example, a dry pump, a turbo molecular pump, or the like, and evacuates the inside of the processing container 10 via the exhaust line 31.

[Pipe Connection Structure]

An example of a pipe connection structure 100 included in the processing apparatus 1 of FIG. 1 will be described with reference to FIGS. 2 to 8B.

The pipe connection structure 100 includes a first pipe 110, a second pipe 120, a pipe clamp 130, and the like.

The first pipe 110 is a straight pipe having an inner diameter ID11. The first pipe 110 includes a flange portion 111, a sealing member 112, a sliding member 113, and the like.

The flange portion 111 is provided at one end (−z direction side end portion) of the first pipe 110. The flange portion 111 has a connection surface 111a connected to a flange portion 121 of the second pipe 120, which will be described later.

The sealing member 112 is provided on the connection surface 111a of the flange portion 111. The sealing member 112 seals the gap between the flange portion 111 and the flange portion 121. This ensures the airtightness in the first pipe 110 and the second pipe 120. The sealing member 112 is, for example, an O-ring.

The sliding member 113 is provided on the connection surface 111a of the flange portion 111. The sliding member 113 makes smooth the relative movement of the flange portion 111 and the flange portion 121 at the time of positioning them. As a result, it is possible to suppress the generation of particles such as metal powder or the like due to the rubbing between the flange portion 111 and the flange portion 121. The sliding member 113 is, for example, a ball roller.

The second pipe 120 is a straight pipe having an inner diameter ID21 and expanding in diameter in a tapered shape toward one end (+z direction side end) thereof. The inner diameter ID21 of the second pipe 120 is the same as the inner diameter ID11 of the first pipe 110. However, the inner diameter ID21 of the second pipe 120 may be different from the inner diameter ID11 of the first pipe 110. The second pipe 120 includes a flange portion 121, an annular protrusion 122, and the like.

The flange portion 121 is provided at one end (+z direction side end portion) of the second pipe 120. The flange portion 121 has a connection surface 121a connected to the flange portion 111 of the first pipe 110. The flange portion 121 has an inner diameter ID22 larger than that of the flange portion 111. As a result, even when the flange portion 111 and the flange portion 121 are connected at a position where the pipe axis Z1 of the first pipe 110 and the pipe axis Z2 of the second pipe 120 do not coincide with each other, the cross-sectional area of a flow path does not decrease at the part where the flange portion 111 and the flange portion 121 are connected to each other. Therefore, it is possible to suppress a change in the flow of the processing gas at the portion where the flange portion 111 and the flange portion 121 are connected to each other. However, the flange portion 121 may have the same inner diameter as the flange portion 111. Further, the flange portion 121 has an outer diameter larger than that of the flange portion 111.

Figure 4:
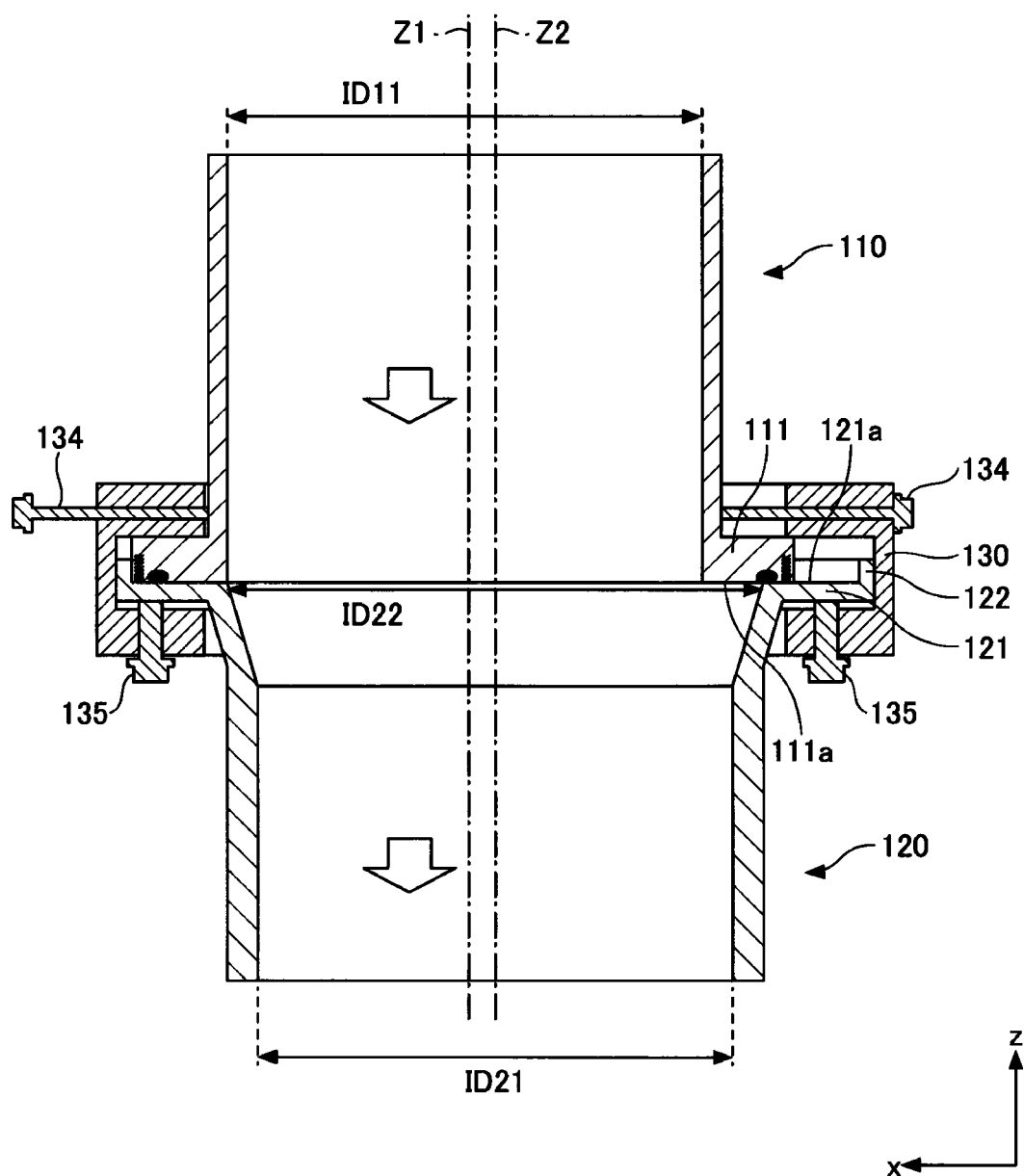
FIG. 4 is a sectional view showing an example of a pipe connection structure according to an embodiment.
Figure 5:
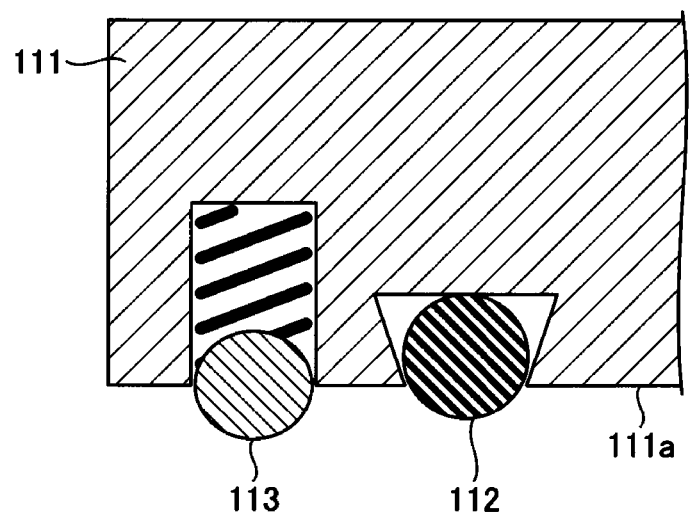
FIG. 5 is an enlarged view showing a part of a first flange portion.
Figure 7A:
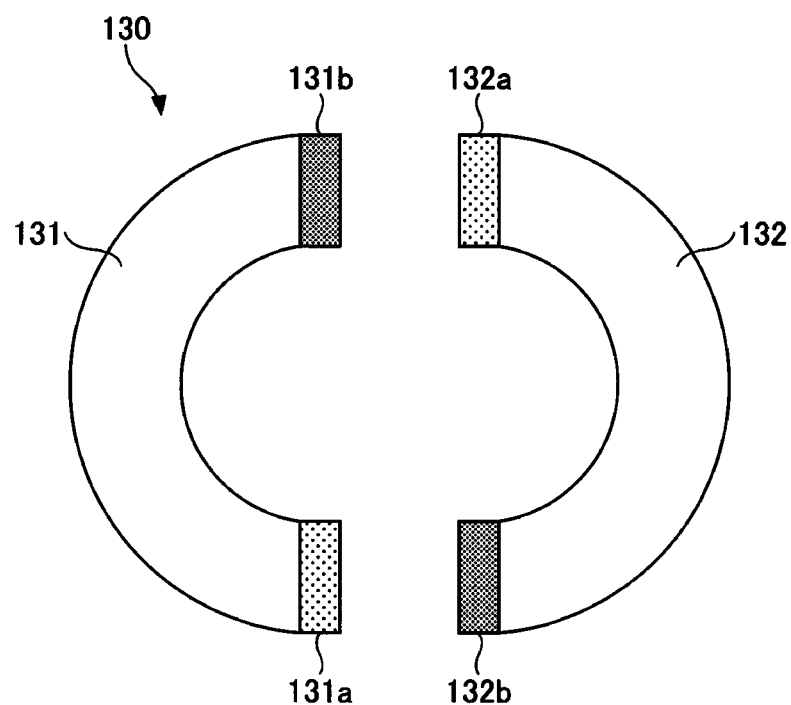
FIGS. 7A and 7B are diagrams showing an example of a pipe clamp.
Figure 7B:
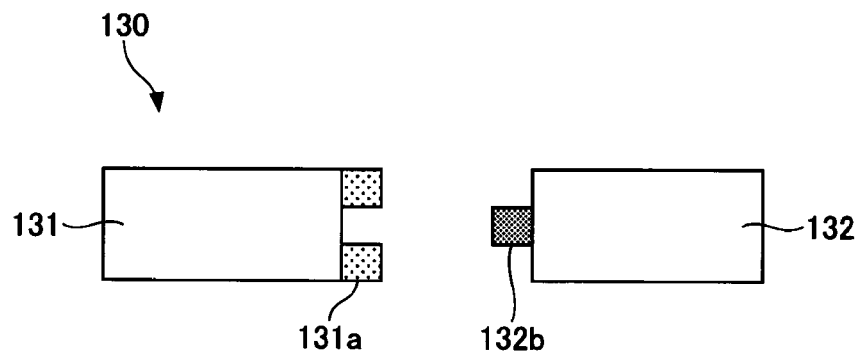
Figure 8A:
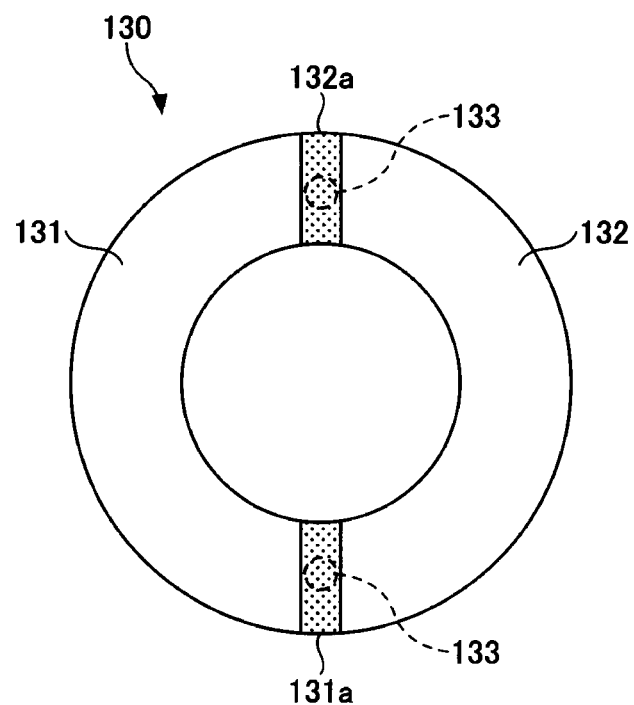
FIGS. 8A and 8B are diagrams showing another example of a pipe clamp.
Figure 8B:
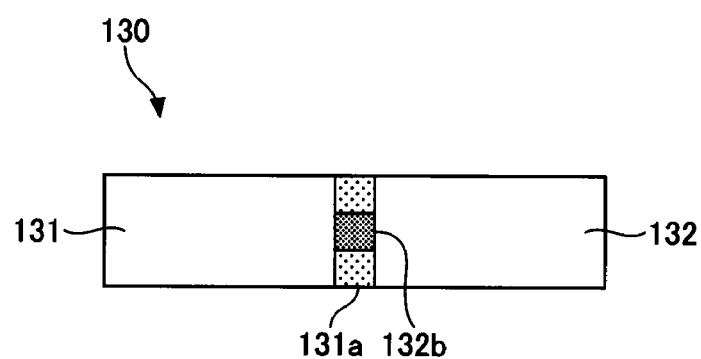

The annular protrusion 122 protrudes from the connection surface 121a of the flange portion 121 and has a ring shape with an inner diameter larger than the outer diameter of the flange portion 111. The annular protrusion 122 comes into contact with the outer wall of the flange portion 111 at the time of positioning the flange portion 111 and the flange portion 121, thereby limiting the movement of the flange portion 111 to a predetermined range. FIG. 4 shows a state in which the left inner wall of the annular protrusion 122 is in contact with the outer wall of the flange portion 111.

The pipe clamp 130 connects and fastens the flange portion 111 and the flange portion 121 at a plurality of positions including a position where the pipe axis Z1 of the first pipe 110 and the pipe axis Z2 of the second pipe 120 coincide with each other and a position where the pipe axis Z1 of the first pipe 110 and the pipe axis Z2 of the second pipe 120 do not coincide with each other. For example, as shown in the connection form A of FIG. 6, the pipe clamp 130 connects and fastens the flange portion 111 and the flange portion 121 at a position where the pipe axis Z1 is shifted to the right side of the pipe axis Z2. Further, for example, as shown in the connection form B of FIG. 6, the pipe clamp 130 connects and fastens the flange portion 111 and the flange portion 121 at a position where the pipe axis Z1 and the pipe axis Z2 coincide with each other. Further, for example, as shown in the connection form C of FIG. 6, the pipe clamp 130 connects and fastens the flange portion 111 and the flange portion 121 at a position where the pipe axis Z1 is shifted to the left side of the pipe axis Z2. Since the pipe clamp 130 connects and fastens the flange portion 111 and the flange portion 121 at the plurality of positions including the position where the pipe axis Z1 and the pipe axis Z2 do not coincide with each other as described above, it is possible to absorb an error generated when assembling an apparatus.

The pipe clamp 130 includes a first holding member 131, a second holding member 132, a fixing member 133, a position adjusting member 134, a pressing member 135, and the like.

The first holding member 131 has a semicircular arc shape in a plan view. The first holding member 131 includes a recess portion 131a and a protrusion portion 131b.

The second holding member 132 has a semicircular arc shape in a plan view. The second holding member 132 includes a recess portion 132a and a protrusion portion 132b.

The fixing member 133 connects and fixes the first holding member 131 and the second holding member 132. The fixing member 133 is, for example, a screw.

The first holding member 131 and the second holding member 132 connect and fasten the flange portion 111 and the flange portion 121 by fitting the protrusion portion 132b into the recess portion 131a, fitting the protrusion portion 131b into the recess portion 132a, and fixing flange portion 111 and the flange portion 121 with the fixing member 133. As described above, the first holding member 131 and the second holding member 132 are configured to be separable.

The position adjusting member 134 adjusts the relative position between the first pipe 110 and the second pipe 120. The position adjusting member 134 is provided, for example, to radially pass through the first holding member 131 or the second holding member 132 and includes a plurality of screws that makes contact with the pipe wall of the first pipe 110 to move the first pipe 110 in the direction perpendicular to the pipe axis Z1.

The pressing member 135 presses the flange portion 111 and the flange portion 121 toward each other. The pressing member 135 is provided, for example, to pass through the first holding member 131 or the second holding member 132 in the thickness direction and includes a plurality of screws that makes contact with the flange portion 121 to press the flange portion 121 toward the flange portion 111.

As described above, the pipe connection structure 100 of the embodiment includes the pipe clamp 130 for connecting and fastening the flange portion 111 and the flange portion 121 at the plurality of positions including the position where the pipe axis Z1 and the pipe axis Z2 do not coincide with each other. As a result, the pipe connection structure 100 has a degree of freedom in the plane direction (xy direction) perpendicular to the pipe axis Z1 and the pipe axis Z2. Therefore, it is possible to absorb an error generated in the xy direction when assembling the apparatus.

Further, unlike a bellows, the pipe connection structure 100 of the embodiment does not have a complicated structure having a large surface area. Therefore, it is possible to easily take a measure against corrosion, such as coating or the like.

Figure 9:
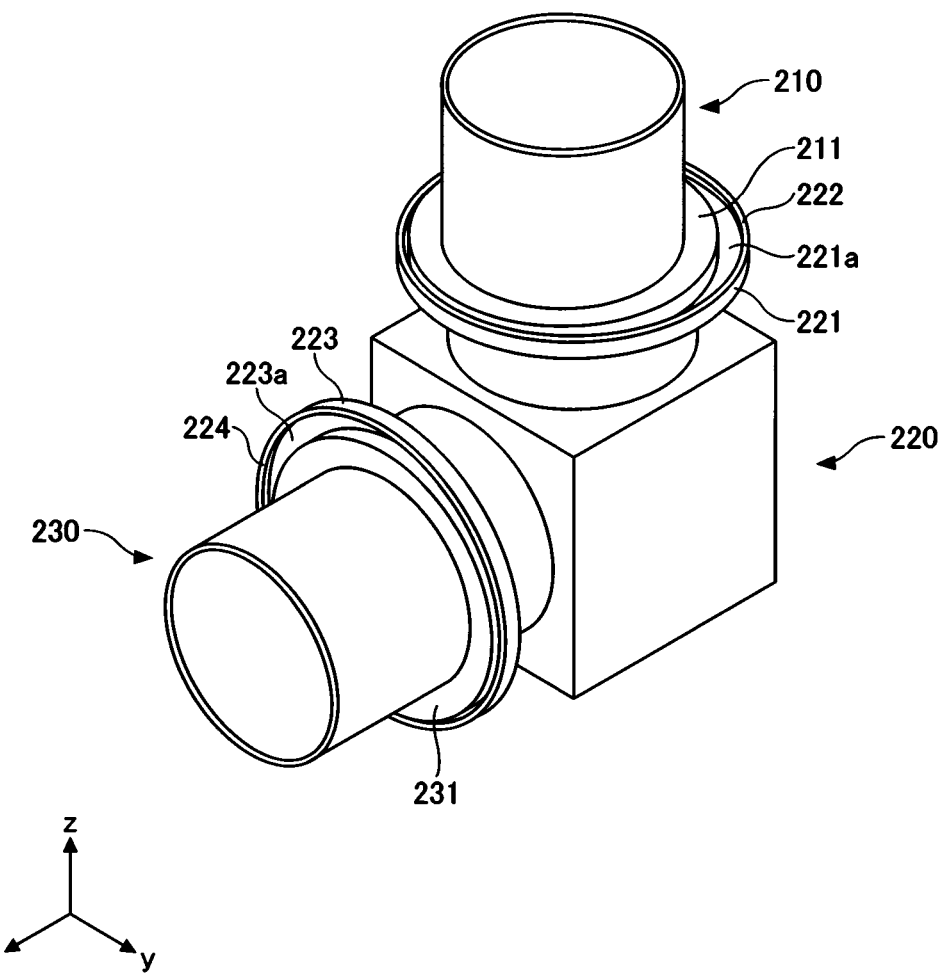
FIG. 9 is a perspective view showing another example of the pipe connection structure according to the embodiment.

An example of a pipe connection structure 200 included in the processing apparatus 1 of FIG. 1 will be described with reference to FIG. 9.

The pipe connection structure 200 differs from the above-mentioned pipe connection structure 100 in that the second pipe 220 is an L-shaped pipe that connects the first pipe 210 and the third pipe 230.

The pipe connection structure 200 includes a first pipe 210, a second pipe 220, a third pipe 230, a first pipe clamp, a second pipe clamp, and the like. In FIG. 9, the first pipe clamp and the second pipe clamp are not shown.

The first pipe 210 may have the same configuration as the above-mentioned first pipe 110. That is, the first pipe 210 is a straight pipe and includes a flange portion 211, a sealing member (not shown), a sliding member (not shown), and the like.

The second pipe 220 is an L-shaped pipe. The second pipe 220 includes a flange portion 221, an annular protrusion 222, a flange portion 223, an annular protrusion 224, and the like.

The flange portion 221 is provided at one end (+z direction side end portion) of the second pipe 220. The flange portion 221 has a connection surface 221a connected to the flange portion 211 of the first pipe 210. The flange portion 221 has an inner diameter larger than that of the flange portion 211. As a result, even when the flange portion 211 and the flange portion 221 are connected at a position where the pipe axis of the first pipe 210 and the pipe axis of the second pipe 220 do not coincide with each other, the cross-sectional area of the flow path does not decrease in the part where the flange portion 211 and the flange portion 221 are connected. Therefore, it is possible to suppress a change in the flow of the processing gas at the part where the flange portion 211 and the flange portion 221 are connected. However, the flange portion 221 may have the same inner diameter as the flange portion 211. Further, the flange portion 221 has a larger outer diameter than the flange portion 211.

The annular protrusion 222 protrudes from the connection surface 221a of the flange portion 221 and has a ring shape with an inner diameter larger than the outer diameter of the flange portion 211. The annular protrusion 222 comes into contact with the outer wall of the flange portion 211 at the time of positioning the flange portion 211 and the flange portion 221, thereby limiting the movement of the flange portion 211 to a predetermined range. FIG. 9 shows a state in which the +x direction side inner wall of the annular protrusion 222 is in contact with the outer wall of the flange portion 211.

The flange portion 223 is provided at the other end (+x direction side end portion) of the second pipe 220. The flange portion 223 has a connection surface 223a connected to the flange portion 231 of the third pipe 230. The flange portion 223 has an inner diameter larger than that of the flange portion 231. As a result, even when the flange portion 223 and the flange portion 231 are connected at a position where the pipe axis of the second pipe 220 and the pipe axis of the third pipe 230 do not coincide with each other, the cross-sectional area of the flow path does not decrease in the part where the flange portion 223 and the flange portion 231 are connected. Therefore, it is possible to suppress a change in the flow of the processing gas at the part where the flange portion 223 and the flange portion 231 are connected. However, the flange portion 223 may have the same inner diameter as the flange portion 231. Further, the flange portion 223 has a larger outer diameter than the flange portion 231.

The annular protrusion 224 protrudes from the connection surface 223a of the flange portion 223 and has a ring shape with an inner diameter larger than the outer diameter of the flange portion 231. The annular protrusion 224 comes into contact with the outer wall of the flange portion 231 at the time of positioning the flange portion 231 and the flange portion 223, thereby limiting the movement of the flange portion 231 to a predetermined range. FIG. 9 shows a state in which the +y direction side inner wall of the annular protrusion 224 is in contact with the outer wall of the flange portion 231.

The third pipe 230 may have the same configuration as the first pipe 110 described above. That is, the third pipe 230 is a straight pipe and includes a flange portion 231, a sealing member (not shown), a sliding member (not shown), and the like.

The first pipe clamp connects and fastens the flange portion 211 and the flange portion 221 at a plurality of positions including a position where the pipe axis of the first pipe 210 and the pipe axis of the second pipe 220 coincide with each other and a position where the pipe axis of the first pipe 210 and the pipe axis of the second pipe 220 do not coincide with each other. The first pipe clamp may have the same configuration as the pipe clamp 130 described above.

The second pipe clamp connects and fastens the flange portion 223 and the flange portion 231 at a plurality of positions including a position where the pipe axis of the second pipe 220 and the pipe axis of the third pipe 230 coincide with each other and a position where the pipe axis of the second pipe 220 and the pipe axis of the third pipe 230 do not coincide with each other. The second pipe clamp may have the same configuration as the pipe clamp 130 described above.

As described above, the pipe connection structure 200 of the embodiment includes the pipe clamp for connecting and fastening the flange portion 211 and the flange portion 221 at the plurality of positions including the position where the pipe axis of the first pipe 210 and the pipe axis of the second pipe 220 do not coincide with each other. As a result, the pipe connection structure 200 has a degree of freedom in the plane direction (xy direction) perpendicular to the pipe axis of the first pipe 210 and the pipe axis of the second pipe 220. Therefore, it is possible to absorb an error generated in the xy direction when assembling the apparatus.

Further, the pipe connection structure 200 of the embodiment includes the pipe clamp for connecting and fastening the flange portion 223 and the flange portion 231 at the plurality of positions including the position where the pipe axis of the second pipe 220 and the pipe axis of the third pipe 230 do not coincide with each other. As a result, the pipe connection structure 200 has a degree of freedom in the plane direction (yz direction) perpendicular to the pipe axis of the second pipe 220 and the pipe axis of the third pipe 230. Therefore, it is possible to absorb an error generated in the yz direction when assembling the apparatus.

As described above, according to the pipe connection structure 200 of the embodiment, it is possible to absorb geometrical tolerances in the directions other than the rotation direction with respect to the y-axis.

Further, unlike a bellows, the pipe connection structure 200 of the embodiment does not have a complicated structure having a large surface area. Therefore, it is possible to easily take a measure against corrosion, such as coating or the like.

In the above-described embodiments, the flange portions 111 and 211 are examples of the first flange portion, the flange portions 121 and 221 are examples of the second flange portion, and the flange portion 231 is an example of the third flange portion. As an example, the flange portion 223 is an example of the fourth flange portion.

According to the present disclosure in some embodiments, it is possible to absorb an error generated when assembling an apparatus.

While certain embodiments have been described, these embodiments have been presented by way of example only and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A pipe connection structure included in a processing apparatus, comprising:
    a first pipe having a first flange portion formed at one end of the first pipe;
    a second pipe having a second flange portion formed at one end of the second pipe and connected to the first flange portion; and
    a pipe clamp configured to connect and fasten the first flange portion and the second flange portion at a plurality of positions including a position where a pipe axis of the first pipe and a pipe axis of the second pipe do not coincide with each other, and
    wherein the second flange portion includes an annular protrusion protruding from a connection surface connected to the first flange portion and having an inner diameter larger than an outer diameter of the first flange portion.

2. The pipe connection structure of claim 1, wherein the second flange portion has the inner diameter larger than the first flange portion.

3. The pipe connection structure of claim 2, wherein the second flange portion has an outer diameter larger than the first flange portion.

4. The pipe connection structure of claim 3, wherein the pipe clamp includes a holding member configured to hold the first flange portion and the second flange portion.

5. The pipe connection structure of claim 4, wherein the holding member is separable into a plurality of parts.

6. The pipe connection structure of claim 5, wherein the pipe clamp includes a position adjusting member configured to adjust a relative position between the first pipe and the second pipe.

7. The pipe connection structure of claim 6, wherein the position adjusting member is provided so as to penetrate the holding member and includes a plurality of screws configured to come into contact with a pipe wall of the first pipe and move the first pipe in a direction perpendicular to the pipe axis of the first pipe.

8. The pipe connection structure of claim 7, wherein the pipe clamp includes a pressing member configured to press the first flange portion and the second flange portion toward each other.

9. The pipe connection structure of claim 8, wherein the pressing member is provided so as to penetrate the holding member and includes a plurality of screws configured to come into contact with the second flange portion and press the second flange portion toward the first flange portion.

10. The pipe connection structure of claim 9, wherein the first pipe includes a sealing member provided on a connection surface of the first flange portion connected to the second flange portion.

11. The pipe connection structure of claim 4, wherein the pipe clamp includes a position adjusting member configured to adjust a relative position between the first pipe and the second pipe.

12. The pipe connection structure of claim 4, wherein the pipe clamp includes a pressing member configured to press the first flange portion and the second flange portion toward each other.

13. The pipe connection structure of claim 1, wherein the second flange portion has an outer diameter larger than the first flange portion.

14. The pipe connection structure of claim 1, wherein the pipe clamp includes a holding member configured to hold the first flange portion and the second flange portion.

15. The pipe connection structure of claim 1, wherein the first pipe includes a sealing member provided on a connection surface of the first flange portion connected to the second flange portion.

16. The pipe connection structure of claim 1, wherein the first pipe includes a sliding member provided on a connection surface of the first flange portion connected to the second flange portion.

17. The pipe connection structure of claim 1, wherein the second pipe is an L-shaped pipe having a fourth flange portion at the other end of the second pipe, and wherein the structure further comprises:
    a third pipe having a third flange portion formed at one end of the third pipe and connected to the fourth flange portion; and
    a second pipe clamp configured to connect and fasten the third flange portion and the fourth flange portion at a plurality of positions including a position where a pipe axis on the other end side of the second pipe and a pipe axis of the third pipe do not coincide with each other.

18. A processing apparatus, comprising:
    a processing container having an exhaust port; and
    an exhaust pipe connected to the exhaust port,
    wherein the exhaust pipe includes:
        a first pipe having a first flange portion formed at one end of the first pipe;
        a second pipe having a second flange portion formed at one end of the second pipe and connected to the first flange portion; and
        a pipe clamp configured to connect and fasten the first flange portion and the second flange portion at a plurality of positions including a position where a pipe axis of the first pipe and a pipe axis of the second pipe do not coincide with each other, and wherein the second flange portion includes an annular protrusion protruding from a connection surface connected to the first flange portion and having an inner diameter larger than an outer diameter of the first flange portion.

* * * * *